United States Patent [19]

Kerr et al.

[11] Patent Number: 5,717,328

[45] Date of Patent: Feb. 10, 1998

[54] METHOD AND APPARATUS FOR USING A MINIATURE PROBE AS A HAND HELD PROBE

[75] Inventors: Brian W. Kerr, Colorado Springs; Werner Haussmann, Loveland; Thomas J. Zamborelli, Colorado Springs, all of Colo.

[73] Assignee: Hewlett-Packard Company, Palo Alto, Calif.

[21] Appl. No.: 757,420

[22] Filed: Nov. 27, 1996

Related U.S. Application Data

[63] Continuation of Ser. No. 678,004, Jul. 10, 1996, abandoned.

[51] Int. Cl.⁶ .................. G01R 1/04; G01R 1/06; G01R 31/02; H01R 11/18
[52] U.S. Cl. .................. 324/149; 324/72.5; 324/754; 324/757; 439/482
[58] Field of Search .................. 324/72.5, 133, 324/149, 555, 556, 754, 757, 758, 761; 439/169, 219, 482

[56] References Cited

U.S. PATENT DOCUMENTS

| | | | |
|---|---|---|---|
| 2,916,699 | 12/1959 | Eisenberg et al. | 324/72.5 |
| 4,014,343 | 3/1977 | Esty | 439/482 X |
| 4,051,432 | 9/1977 | Sarjeant | 324/72.5 |
| 4,209,742 | 6/1980 | Bender et al. | 324/72.5 |
| 4,259,635 | 3/1981 | Triplett | 324/149 |
| 4,394,620 | 7/1983 | Montalto et al. | 324/72.5 X |
| 5,001,421 | 3/1991 | Kawada et al. | 324/754 |
| 5,084,673 | 1/1992 | Kazama | 324/761 |
| 5,136,237 | 8/1992 | Smith et al. | 324/149 |
| 5,574,359 | 11/1996 | Arthur | 324/72.5 |

FOREIGN PATENT DOCUMENTS 4224186  1/1994  Germany ............ 439/482

OTHER PUBLICATIONS

Bocinski et al, "Connector Probe" IBM Tech. Discl. Bull. vol. 16 No. 9 Feb. 1974, p. 2825.

*Primary Examiner*—Gerard R. Strecker

[57] ABSTRACT

A probe adapter may comprise an elongate body having a nose section, a tail section, and a generally U-shaped elongate slot for receiving a probe. The U-shaped elongate slot has a front end that is located a space distance from the nose section of the elongate body. A probe tip assembly mounted to the nose section of the elongate body is adapted to engage the signal input terminal of the probe so that the signal input terminal of the probe is electrically connected to the probe tip assembly when the probe is positioned within the elongate slot.

22 Claims, 4 Drawing Sheets

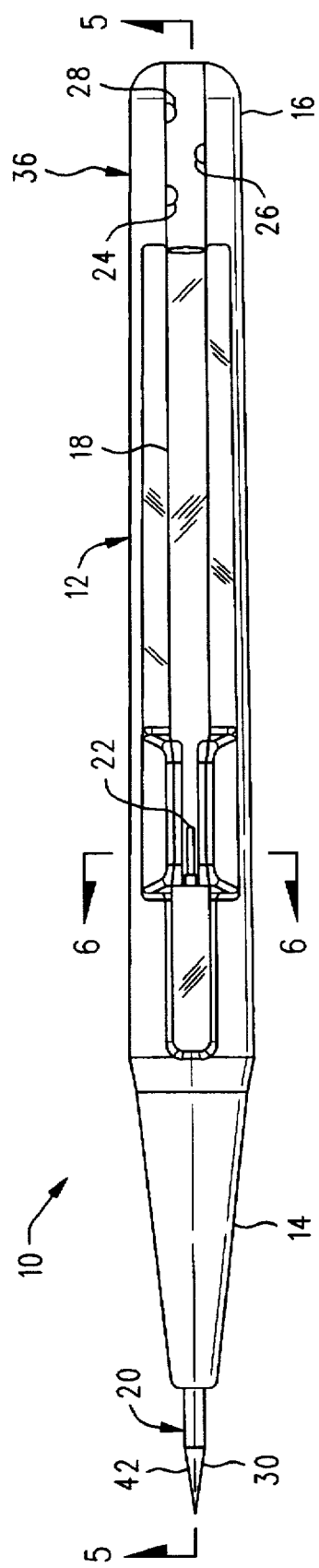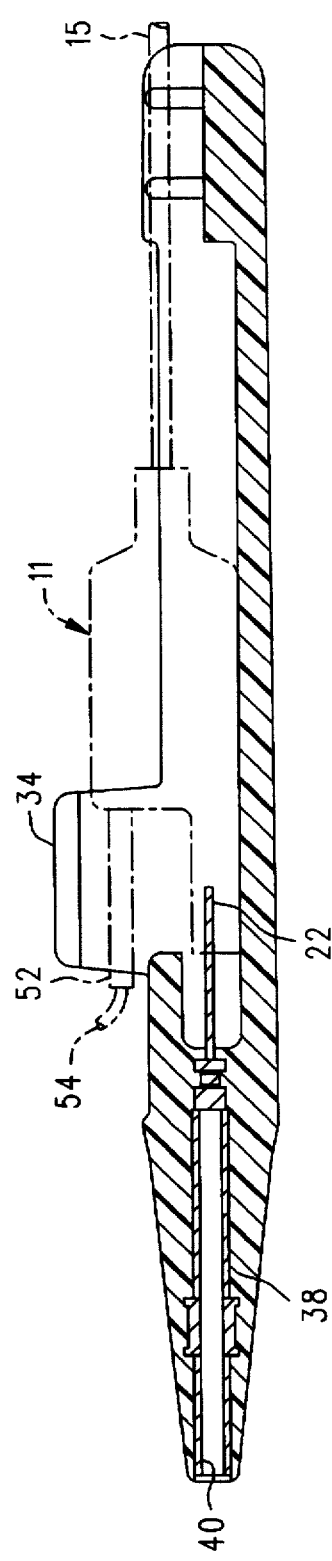

METHOD AND APPARATUS FOR USING A MINIATURE PROBE AS A HAND HELD PROBE

CROSS-REFERENCE TO RELATED APPLICATION

This is a continuation of U.S. patent application Ser. No. 08/678,004, filed on Jul. 10, 1996, now abandoned.

FIELD OF INVENTION

This invention relates to test devices in general and more specifically to miniature probes used for detecting signals on electronic circuits and devices.

BACKGROUND

Miniature probes are devices that are commonly used to connect test instruments, such as logic analyzers, to various kinds of electronic circuits and/or devices. An example of a miniature logic probe 11 is shown in FIGS. 1 and 2 and may comprise a probe body 13 having a generally rectangular shape with a multiple conductor signal lead 15 attached thereto. One of the conductors of the signal lead 15 may be connected to a female signal terminal 19 (FIG. 2) contained within the elongate signal terminal extension 17. Similarly, another of the conductors may be connected to a female ground terminal 21, as best seen in FIG. 2. The other end of the signal lead 15 may terminate in a connecter (not shown) suitable for connection to the particular test instrument being used.

The test instrument (not shown) may be connected to the electronic circuit or device being tested (not shown) by engaging the female signal terminal 19 on the test probe 11 with a mating male test connector pin (not shown) provided on the electronic circuit or device being tested. If a ground connection is required, the female ground terminal 21 (FIG. 2) may be connected to a suitable ground by a ground wire 54 having a male connecter 52 adapted to engage the female ground terminal 21.

While the foregoing described arrangement is suitable for testing electronic circuits and devices containing male connector pins configured to engage the female signal terminal 19 on the probe 11, it is not particularly well-suited for testing circuits or devices that do not include such male connector pins. Similarly, the arrangement is not particularly efficient if it is desired to quickly move the probe 11 from point to point on the electronic circuit as the probe 11 must be carefully engaged and disengaged from the various male connector pins on the circuit before a new point can be tested or probed. Also, in certain instances, the ground wire 54 and connector 52 may interfere with the user's ability to engage the female signal terminal 19 with a male connector pin on the circuit.

Partly in an attempt to solve some of the foregoing problems, many users have come up with various improvisations for the above-described arrangement. One such improvisation has been to insert a small piece of wire, such as part of a lead clipped from a resistor, into the female signal terminal 19 of the logic probe. The electrical circuit or device can then be probed by contacting the end of the wire lead with the desired point on the circuit or device. While this improvisation is usually effective from a functional standpoint, it is cumbersome to implement in practice and requires considerable manual dexterity on the part of the user in order to achieve good electrical contact and to avoid intermittent short circuits. The small size of the logic probe, which is required for good high frequency response, also contributes to this problem. It is also difficult to maintain contact between the desired circuit element and the end of the wire lead, particularly if the wire lead is relatively soft, thus prone to bend. Of course, the ground wire 54 and associated connector 52 may also make it difficult to make a reliable electrical contact.

While other improvisations have been used, they are similar to the one just described and generally involve inserting some type of supplemental electrical conductor, such as a length of insulated stranded wire, into the female signal terminal 19 in order to allow it to be electrically connected to the desired point on the electronic circuit. Needless to say, such improvisations are beset with similar problems, including difficulty in maneuvering the end of the wire to the proper point of the circuit while ensuring that the other end of the wire remains firmly inserted within the female signal terminal 19 of the logic probe 11. Of course, care must be taken to avoid creating a short circuit. Further, if the extension wire is very long, it may adversely affect the ability of the probe 11 to measure certain high frequency signals.

Consequently, a need exists for an improved probe for connecting test apparatus to various points or nodes on electronic circuits or devices. Ideally, such a probe would retain the ability to be connected to any male connector pins provided on the electronic circuit or device, yet allow the probe to be quickly moved from point to point on the electronic circuit or device to allow more rapid testing of various points on the electronic circuit or device without the fear of creating intermittent short circuits or adversely affecting the measurement of high frequency signals. Additional utility could be gained if such an improved probe would minimize the manual dexterity required to use the probe.

SUMMARY OF THE INVENTION

Accordingly, a probe adapter according to the present invention may comprise an elongate body having a nose section, a tail section, and a generally U-shaped slot elongate slot for receiving a probe. The U-shaped elongate slot has a front end that is located a spaced distance from the nose section of the elongate body. A probe tip assembly mounted to the nose section of the elongate body is adapted to engage the signal input terminal of the probe so that the signal input terminal of the probe is electrically connected to the probe tip assembly when the probe is positioned within the elongate slot. The elongate body may optionally include a strain relief section for frictionally engaging a signal lead attached to the probe. In another embodiment, the probe tip assembly may include a spring-biased, axially moveable probe pin.

BRIEF DESCRIPTION OF THE DRAWINGS

Illustrative and presently preferred embodiments of the invention are shown in the accompanying drawings in which:

FIG. 4 is a top view of the probe adapter showing the probe receiving slot and the bosses comprising the strain relief section;

FIG. 5 is a cross-section view in elevation of the probe adapter taken along the lines 5—5 of FIG. 4, but with the pogo tip assembly removed and with a logic probe and ground lead shown in phantom lines;

DETAILED DESCRIPTION OF THE INVENTION

Figure 1:
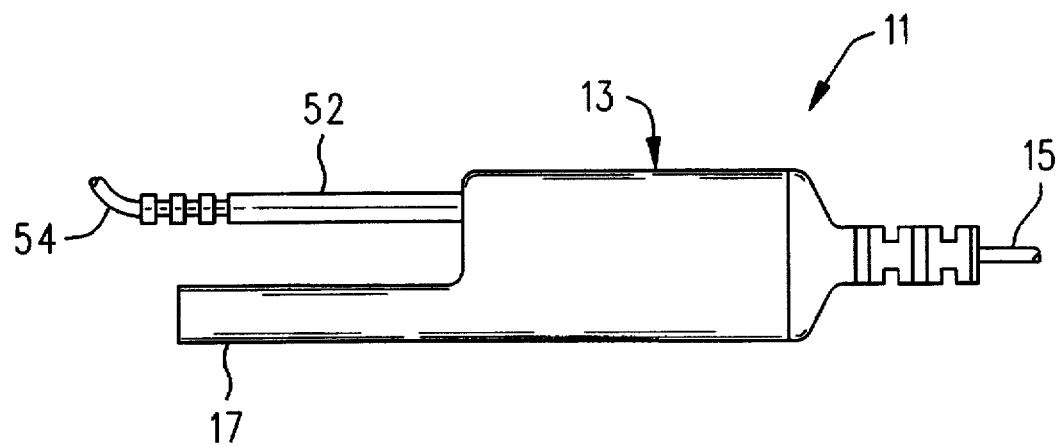
FIG. 1 is a side view in elevation of a prior art logic probe.
Figure 2:
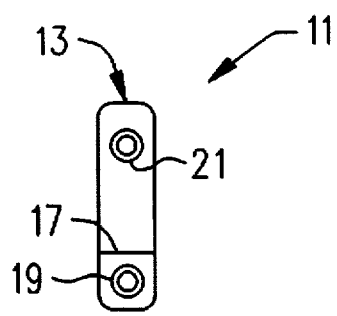
FIG. 2 is a front view in elevation of the prior art logic probe shown in FIG. 1 but with the optional ground wire removed to more clearly show the female signal and ground terminals.
Figure 3:
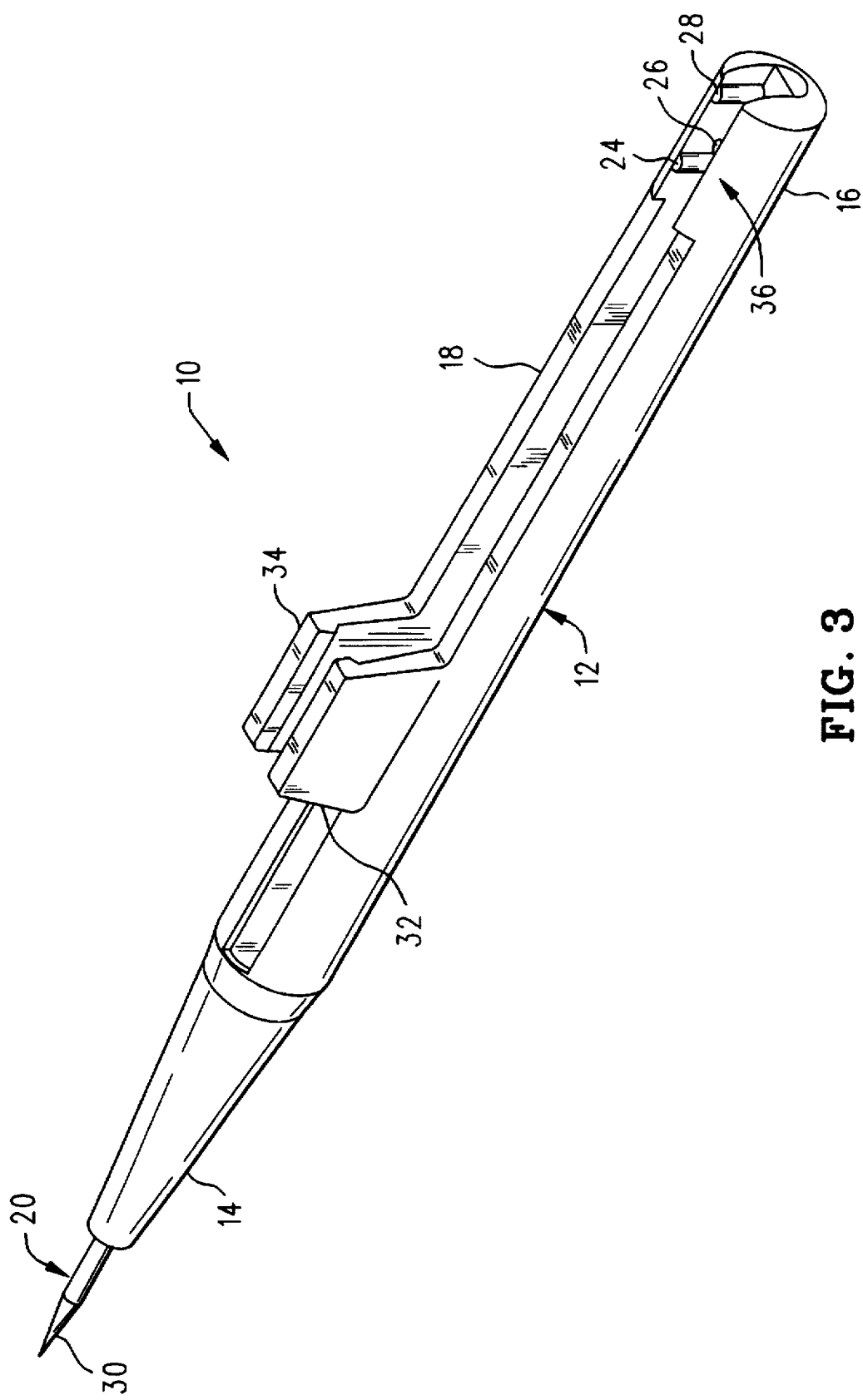
FIG. 3 is a perspective view of the probe adapter according to the present invention.

A probe adapter 10 according to the present invention is best seen in FIGS. 3–5 as it could be used in conjunction with a conventional logic probe 11 of the type shown in FIGS. 1 and 2. More specifically, the probe adapter 10 includes an elongate body 12 having a nose section 14, a tail section 16, and an elongate slot 18 for receiving the logic probe 11. In one preferred embodiment, the slot 18 is configured to receive a conventional logic probe 11 of the type shown in FIGS. 1 and 2 in the manner best seen in FIG. 5. Alternatively, the slot 18 could be configured to receive other types of probes. In one preferred embodiment, the main body 12 of probe adapter 10 may also include strain relief section 36 comprising a plurality of strain relief bosses 24, 26, and 28 to grip the signal lead 15 of logic probe 11. The strain relief section 36 thus helps to prevent the logic probe 11 from being accidently pulled loose from the probe adapter 10. Strain relief section 36 also provides a convenient way to hold the signal lead 15 away from the main body 12 to help prevent the signal lead 15 from becoming entangled with the probe adapter 10 and/or ground wire 54. The main body 12 of probe adapter 10 may also include a pair of pads 32, 34 which frictionally engage the male connector 52 of ground wire 54 to help prevent it from being accidently pulled loose. The pads 32, 34 also enhance the user's ability to grip and maneuver the probe adapter 10 and provide additional mechanical protection for the logic probe 11.

A probe tip assembly 20 attached to the nose section 14 of main body 12 provides the means for electrically connecting the signal input terminal 19 of logic probe 11 (FIG. 2) to the desired point on the electrical circuit or device (not shown) being tested. In one preferred embodiment, the probe tip assembly 20 includes a "pogo" tip assembly 42 (FIG. 7), an electrically conductive sleeve 40, and a male connector pin 22. The "pogo" tip assembly 42 (FIG. 7) includes a spring loaded, axially moveable probe tip 30 and is designed to be slidably received by sleeve 40. The male connector pin 22 (FIGS. 4 and 5), which is electrically connected to the sleeve 40, in turn engages the female signal terminal 19 (FIG. 2), thereby electrically connecting the female signal terminal 19 to the probe pin 30.

The probe adapter 10 according to the present invention may be used by first mounting the logic probe 11 to the adapter 10 by sliding the female signal input terminal 19 onto the male connector pin 22. See FIG. 5. If a ground connection is desired or required, the male connector 52 of a separate ground wire 54 may be connected to the female ground terminal 21 (FIG. 2) of logic probe 11, as is also best seen in FIG. 5. The logic probe 11 may then be used to probe various electronic components and devices (not shown) by contacting the probe pin 30 with the desired places on the circuit. Since the probe pin 30 is electrically connected to the female signal input terminal 19 on the logic probe 11, the testing device (not shown) connected to the signal lead 15 of logic probe 11 will sense the electronic signal in the same manner as if the logic probe 11 were connected directly to the circuit point. Alternatively, the logic probe 11 can be turned around within the adapter 10 to engage the female ground terminal 21 with the male connector pin 22. In this manner, the probe adapter 10 can be used to probe ground points on the electronic circuit or device.

A significant advantage of the probe adapter 10 according to the present invention is that it allows the logic probe 11 to be used to probe a wide range of electronic circuits and devices regardless of whether they include male connector pins that are configured to receive the female signal input connector 19 of logic probe 11. The probe adapter 10 also allows the logic probe 11 to be quickly and easily connected to any portion of the electronic circuit or device that can physically accommodate the probe pin 30. The pencil-like shape of the probe adapter is also considerably easier to manipulate than is the relatively small logic probe 11.

Another advantage of the probe adapter 10 is that the logic probe 11 can be easily removed to allow it to be used in the conventional manner, yet be readily converted for hand-held use by simply reinserting it into the logic probe adapter 10. The probe adapter 10 can also be used to probe ground points as well as signal points by simply reversing the position of the logic probe 11 so that the ground terminal 21 is engaged with the male connector pin 22. Also, the relatively small size of the probe tip assembly 20 will not adversely affect the high frequency performance of the logic probe 11. Still another advantage is that the present invention allows a separate ground wire lead 54 and associated connector 52 to be connected to the logic probe 11 without interfering with its use in the probe adapter 10.

Other advantages are associated with the pogo tip assembly 42. For example, the spring-loaded probe pin 30 ensures a reliable electrical connection and provides enhanced tactile feel. The pogo tip assembly 42 is also removable, allowing it to be easily replaced in the event it becomes damaged or otherwise unserviceable.

Having briefly described the probe adapter 10 as well as some of its more significant features and advantages, the probe adapter according to the present invention will now be described in detail. Referring now to FIGS. 3–5 simultaneously, the probe adapter 10 may comprise an elongate main body 12 having a nose section 14, a tail section 16, and an elongate slot 18 for receiving the logic probe 11. The elongate main body 12 may also include a pair of pads 32, 34 to frictionally engage the male connector 52 of ground wire 54, thus help prevent it from being accidently pulled loose from the logic probe 11. The pads 32, 34 also provide a convenient means for gripping the main body 12 and additional mechanical protection for the logic probe 11. See FIG. 5. The tail end 16 of main body 12 may include a strain relief section 36 comprising three strain relief bosses 24, 26, and 28 positioned on opposite sides of the slot 18 in the manner best seen in FIGS. 3 and 4. When the signal lead 15 is routed between the bosses 24, 26, and 28, the strain relief section 36 helps to prevent the logic probe 11 from being pulled loose from the probe adapter 10. Strain relief section 36 also provides a convenient way to route the signal lead 15 away from the probe adapter 10 to help prevent it from becoming entangled with the probe adapter 10 or ground wire 54.

Figure 7:
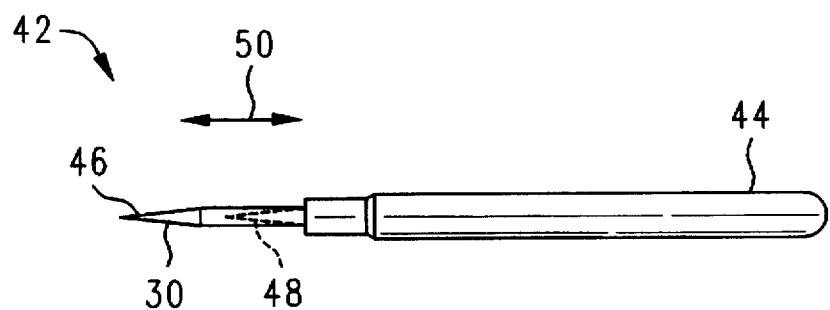
FIG. 7 is a side view in elevation of a pogo tip assembly.

Referring now to FIG. 5, the nose section 14 of main body 12 includes a bore 38 sized to receive a sleeve 40 which is in turn sized to slidably receive and frictionally retain the "pogo" tip assembly 42 shown in FIG. 7. The male connector pin 22 is electrically connected to the sleeve 40 and may be mechanically attached to the sleeve 40 by any convenient means, such as by crimping or by welding. Alternatively, the sleeve 40 and male connector pin 22 may comprise a single, integral part. It is also preferred, but not required, that the external surfaces of the sleeve 40 and male connector pin 22 be plated with a highly conductive, non-corrosive material, such as gold, to ensure reliable electrical contact and maximum signal transfer.

Figure 6:
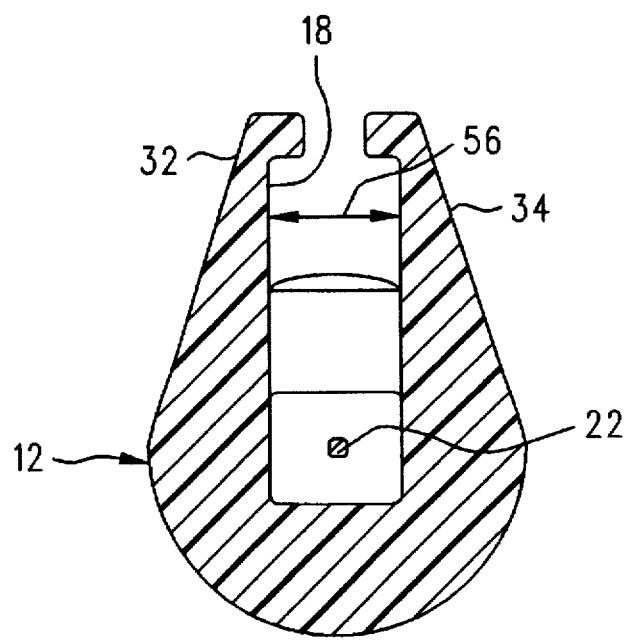
FIG. 6 is a cross-section view in elevation of the probe body taken along the lines 6—6 of FIG. 4.

As was described above, the main body 12 of probe adapter 10 may include a pair of pads 32, 34 to frictionally engage the male connector 52 of ground wire 54. The pads 32, 34 also allow a user to more easily grip and maneuver the logic probe adapter 10. See FIG. 6. In one preferred embodiment, the pads 32, 34 are integral with the main body 12 and are positioned substantially midway between the nose section 14 and tail section 16. A space 56 (FIG. 6) between the pads 32, 34 is sized to frictionally engage the ground wire connector 52, as best seen in FIG. 5.

The "pogo" tip assembly 42 is best seen in FIG. 7 and comprises an external housing 44 having a central bore sized to slidably receive the probe pin 30 so that the probe pin 30 is free to move back and forth within the housing 44 between an extended position 46 and a retracted position 48, i.e., generally in the directions indicated by arrows 50. A biasing device, such as a spring (not shown) contained within housing 44 may be used to bias the probe pin 30 in the extended position 46. It is preferred, but not required, that the probe pin 30 be gold plated to ensure maximum signal transfer. Since such pogo tip assemblies are well-known and readily commercially available, the particular pogo tip assembly 42 used in the present invention will not be described in further detail. However, by way of example, the pogo tip assembly 42 may comprise a model number S25UT-8-G probe tip available from Interconnect Devices, Inc. of Kansas City, Kans., although other probe tip assemblies may be used without departing from the scope of the present invention.

As was described above, the sleeve 40 contained within the bore 38 of nose section 14 should be sized to slidably receive and frictionally retain the housing 44 of pogo tip assembly 42 so that electrical contact is established and maintained between the sleeve 40 and housing 44 of pogo tip assembly 42. The sliding fit between the sleeve 40 and housing 44 will also allow the pogo tip assembly 42 to be replaced in the event it is damaged or otherwise becomes unserviceable. Alternatively, the pogo tip assembly 42 may be non-removable.

It is preferred, but not required, that the main body 12 of probe adapter 10 be molded as a single unitary piece from a non-conductive plastic material, such as nylon, although other materials could also be used. In one embodiment, the main body 12 is formed by an injection molding process and is "overmolded" on the sleeve 40 and male connector pin 22 so that the same are fixedly attached to and captured by the main body 12. However, other fabrication techniques are known and may be used in the alternative to fabricate the main body 12 and to incorporate therein the sleeve 40 and male connector pin 22.

The probe adapter 10 may be used by first mounting the logic probe 11 to the adapter 10 by sliding the female signal input terminal 19 onto the male connector pin 22, as is best seen in FIG. 5. If a ground connection is desired or required, the male connector 52 of a separate ground wire 54 may be connected to the female ground terminal 21 (FIG. 2). Alternatively, if it is desired to probe ground points, the position of the logic probe 11 can be reversed and the female ground terminal 21 inserted onto the male connector pin 22.

In any event, the logic probe 11 may then be used to probe various points by contacting the probe pin 30 of probe adapter 10 with the desired places on the circuit. Since the probe pin 30 is electrically connected to the female signal input terminal 19 (or the female ground terminal 21) on the logic probe 11, the testing device (not shown) connected to the signal lead 15 of logic probe 11 will sense the electronic signal in the same manner as if the logic probe 11 were connected directly to the circuit point.

This completes the detailed description of the probe adapter 10 according to the present invention. While a number of specific components were described above for the preferred embodiments of this invention, persons having ordinary skill in this art will readily recognize that other substitute components or combinations of components may be available now or in the future to accomplish comparable functions to the apparatus described herein. For example, while the probe adapter 10 is shown and described herein as it could be used with a specific type of logic probe (i.e., logic probe 11), other types of logic probes or even other types of probes could be accommodated by making the appropriate changes to the probe adapter 10 and/or elongate slot 18 to accept different probe configurations. Still other modifications are possible. For example, while the present invention incorporates a pogo tip assembly 42 having a spring loaded probe pin 30, a fixed, non-moveable probe pin could also be used. Likewise, the various male and female connectors, e.g., the probe pin 30, sleeve 40, and male connector pin 22, need not be gold plated but instead could be plated with any of a wide variety of materials suitable for use with the expected application.

Therefore, it is contemplated that the inventive concepts herein described may be variously otherwise embodied and it is intended that the appended claims be construed to include alternative embodiments of the invention except insofar as limited by the prior art.

What is claimed is:

1. A probe adapter for receiving a probe having a signal input terminal, comprising:

an elongate body having a nose section, a tail section, and a generally U-shaped elongate slot for receiving the probe, the U-shaped elongate slot having a front end located a spaced distance from the nose section; and a probe tip assembly mounted to the nose section of said elongate body and adapted to engage the signal input terminal of the probe, wherein the signal input terminal of the probe is electrically connected to said probe tip assembly when said probe is positioned within said U-shaped elongate slot.

2. The probe adapter of claim 1, wherein said elongate body includes a bore therethrough extending from the nose section to the elongate slot, said bore being adapted to receive said probe tip assembly.

3. The probe adapter of claim 2, wherein the elongate slot of said body extends substantially to the tail section.

4. The probe adapter of claim 3, wherein said probe tip assembly comprises:

a probe pin;

a housing having a central bore therein adapted to receive said probe pin so that said probe pin can move axially back and forth within the central bore of said housing from a retracted position to an extended position; and a biasing device positioned within said housing for urging said probe pin to the extended position.

5. The probe adapter of claim 4, wherein said probe tip assembly also includes a sleeve adapted to slidably receive said housing of said probe tip assembly, said sleeve also being in electrical contact with a connecter adapted to engage the signal input terminal of the probe.

6. The probe adapter of claim 5 wherein said sleeve and said connector are fixedly mounted within the bore of said elongate body.

7. The probe adapter of claim 6, wherein said elongate body comprises a non-conductive plastic resin material.

8. A probe adapter, comprising:

an elongate body comprising a non-conductive plastic resin material and having a nose section, a tail section, an elongate slot extending from a position located a spaced distance behind the nose section to the tail section, the elongate slot being sized to receive a probe having a signal input terminal, wherein said elongate slot includes a strain relief section positioned at about the tail section of said body, said strain relief section being adapted to frictionally engage a signal lead connected to the probe, and a bore extending from the nose section to the elongate slot; and a probe tip assembly mounted to the nose section of said elongate body and adapted to engage the signal input terminal of the probe, said probe tip assembly having a probe pin, a housing having a central bore therein adapted to receive said probe pin so that said probe pin can move axially back and forth within the central bore of said housing from a retracted position to an extended position, a biasing device positioned within said housing for urging said probe pin to the extended position, a sleeve mounted within the bore in said elongate body for receiving said housing, and a connector electrically connected to said sleeve and extending into the elongate slot in said elongate body, said connector being sized to engage the signal input terminal of the probe.

9. The probe adapter of claim 8, wherein said strain relief section includes first boss and a second boss positioned in spaced apart relation on a first side of said elongate slot and a third boss positioned on a second side of said elongate slot and corresponding to a location substantially between said first and second bosses, said first, second, and third bosses being sized to frictionally engage the signal lead when said signal lead is positioned between said first, second, and third bosses.

10. A probe adapter, comprising:

an elongate body having a nose section, a tail section, and an elongate slot for receiving a probe, the probe having a signal input terminal, said elongate body also including a first pad extending generally outwardly from said elongate body and generally aligned with a longitudinal axis of said elongate body, and a second pad extending generally outwardly from said elongate body and generally aligned with the longitudinal axis of said elongate body, the first and second pads being positioned in spaced-apart relation on opposite sides of said elongate slot at respective locations about midway between the nose section and the tail section, said first and second pads allowing a user to grasp said probe adapter; and a probe tip assembly mounted to the nose section of said elongate body and adapted to engage the signal input terminal of the probe, wherein the signal input terminal of the probe is electrically connected to said probe tip assembly when said probe is positioned within said elongate slot.

11. The probe adapter of claim 1, wherein said probe includes a ground terminal and wherein said probe tip assembly is adapted to engage the ground terminal of the probe.

12. A method for using a probe, comprising the steps of:

inserting the probe into a probe adapter body, the probe adapter body including a nose section, a tail section, a generally U-shaped elongate slot adapted to receive said probe, the U-shaped elongate slot having a front end located a spaced distance from the nose section, and a probe tip assembly mounted to the nose section of said probe adapter body for engaging a signal input terminal of the probe, the probe tip assembly terminating in a probe pin;

engaging the signal input terminal of the probe with said probe tip assembly; and contacting said probe pin with an electrical conductor having an electrical signal contained thereon.

13. A method for using a probe, comprising the steps of:

inserting the probe into a probe adapter body, the probe adapter body including a nose section, a tail section, a generally U-shaped elongate slot adapted to receive said probe, the U-shaped elongate slot having a front end located a spaced distance from the nose section, and a probe tip assembly mounted to the nose section of said probe adapter body for engaging a ground terminal of the probe, the probe tip assembly terminating in a probe pin;

engaging the ground terminal of the probe with said probe tip assembly; and contacting said probe pin with an electrical conductor having an electrical signal contained thereon.

14. A probe adapter for receiving a probe having a signal input terminal, comprising:

an elongate body having a nose section, a tail section, and a U-shaped elongate slot for receiving the probe, the U-shaped elongate slot having a front end located a spaced distance from the nose section, said elongate body also having a bore therein extending from the nose section to the U-shaped elongate slot;

a connector positioned within the bore and adapted to engage the signal input terminal of the probe;

a probe tip assembly positioned within the bore and in electrical contact with said connector, said probe tip assembly including a probe pin.

15. The probe adapter of claim 14, further comprising an electrically conductive sleeve positioned within the bore of said elongate body, said electrically conductive sleeve being electrically connected to said connector and wherein said probe tip assembly is adapted to be slidably received by said sleeve.

16. The probe adapter of claim 15, wherein said probe tip assembly comprises a pogo tip assembly.

17. A probe adapter, comprising:

an elongate body having a nose section, a tail section, and an elongate slot for receiving a probe, the elongate slot extending along a longitudinal axis of said elongate body, the probe having a signal input terminal, wherein said elongate body includes a strain relief section located at about the tail section for frictionally engaging a signal lead connected to said probe, said elongate body also having a bore therein extending from the nose section to the elongate slot;

a connector positioned within the bore and adapted to engage the signal input terminal of the probe; and a probe tip assembly positioned within the bore and in electrical contact with said connector, said probe tip assembly including a probe pin.

18. The probe adapter of claim 17, wherein said elongate body comprises a non-conductive plastic resin.

19. The probe adapter of claim 10, wherein said elongate body includes a bore therein extending from the nose section to the elongate slot, said bore being adapted to receive said probe tip assembly.

20. The probe adapter of claim 19, wherein the elongate slot of said body extends substantially to the tail section.

21. The probe adapter of claim 20, wherein said probe tip assembly comprises:

a probe pin;

a housing having a central bore therein for receiving said probe pin so that said probe pin can move axially back and forth within the central bore of said housing from a retracted position to an extended position; and a biasing device positioned within said housing for urging said probe pin to the extended position.

22. The probe adapter of claim 21, wherein said probe tip assembly also includes a sleeve for slidably receiving said housing of said probe tip assembly, said sleeve also being in electrical contact with a connector sized to engage the signal input terminal of the probe.

* * * * *